US012622039B2

(12) United States Patent
Nakano et al.

(10) Patent No.: US 12,622,039 B2
(45) Date of Patent: May 5, 2026

(54) SCHOTTKY BARRIER DIODE

(71) Applicant: Mitsubishi Electric Corporation,
Tokyo (JP)

(72) Inventors: Seiya Nakano, Tokyo (JP); Yoshifumi Tomomatsu, Tokyo (JP); Yasuo Ata,
Tokyo (JP)

(73) Assignee: Mitsubishi Electric Corporation,
Tokyo (JP)

( * ) Notice: Subject to any disclaimer, the term of this patent is extended or adjusted under 35 U.S.C. 154(b) by 812 days.

(21) Appl. No.: 17/774,080

(22) PCT Filed: Jan. 14, 2020

(86) PCT No.: PCT/JP2020/000900
§ 371 (c)(1),
(2) Date: May 3, 2022

(87) PCT Pub. No.: WO2021/144851
PCT Pub. Date: Jul. 22, 2021

(65) Prior Publication Data
US 2022/0376073 A1 Nov. 24, 2022

(51) Int. Cl.
H10D 64/64 (2025.01)
H10D 8/01 (2025.01)
(Continued)

(52) U.S. Cl.
CPC ............. H10D 64/64 (2025.01); H10D 8/051 (2025.01); H10D 8/60 (2025.01); H10D 62/106 (2025.01)

(58) Field of Classification Search
CPC .......... H10D 64/64; H10D 8/051; H10D 8/60; H10D 62/106; H10D 64/23;
(Continued)

(56) References Cited

U.S. PATENT DOCUMENTS

| 4,607,270 A | 8/1986 | Iesaka |
| 5,969,400 A | 10/1999 | Shinohe et al. |
| | (Continued) | |

FOREIGN PATENT DOCUMENTS

| JP | S59-232467 A | 12/1984 |
| JP | S61-228669 A | 10/1986 |
| | (Continued) | |

OTHER PUBLICATIONS

International Search Report issued in PCT/JP2020/000900; mailed Mar. 31, 2020.
(Continued)

*Primary Examiner* — Steven B Gauthier
*Assistant Examiner* — Khatib A Rahman
(74) *Attorney, Agent, or Firm* — Studebaker Brackett PLLC

(57) ABSTRACT

A Schottky barrier diode according to the present disclosure includes an n-type semiconductor substrate, one or more p-type guard rings provided on a side of an upper surface of the semiconductor substrate, an anode electrode provided on the upper surface of the semiconductor substrate, a cathode electrode provided on a rear surface of the semiconductor substrate and an insulating film provided on an inner guard ring on an innermost side among the one or more guard rings, wherein the anode electrode rides on the insulating film and has its end portion provided just above the inner guard ring, the anode electrode and the inner guard ring are provided away from each other, and a thickness of the insulating film is 1.0 μm or more.

37 Claims, 5 Drawing Sheets

700

(51) Int. Cl.
H10D 8/60 (2025.01)
H10D 62/10 (2025.01)

(58) Field of Classification Search
CPC ............. H10D 62/8325; H10D 64/111; H10D 62/113; H10D 62/114; H10D 62/53; H10D 62/05
See application file for complete search history.

(56) References Cited

U.S. PATENT DOCUMENTS

| | | | |
|---|---|---|---|
| 2008/0217725 A1 | 9/2008 | Tu et al. | |
| 2011/0215338 A1 | 9/2011 | Zhang | |
| 2015/0318357 A1* | 11/2015 | Tadokoro | H10D 64/64 257/77 |
| 2015/0340443 A1* | 11/2015 | Wada | H10D 62/106 257/77 |
| 2015/0357405 A1* | 12/2015 | Ueda | H10D 12/441 257/77 |
| 2016/0071924 A1* | 3/2016 | Masuda | H10D 62/106 257/77 |
| 2016/0351384 A1* | 12/2016 | Atkinson | H01L 21/02274 |
| 2018/0308992 A1* | 10/2018 | Uchida | H10D 12/031 |
| 2019/0109005 A1* | 4/2019 | Ichikawa | H10D 62/8325 |
| 2020/0066920 A1* | 2/2020 | Izumi | H10D 8/043 |
| 2020/0266268 A1* | 8/2020 | Uchida | H10D 8/60 |

FOREIGN PATENT DOCUMENTS

| | | | |
|---|---|---|---|
| JP | S63-138769 A | 6/1988 |
| JP | H08-293618 A | 11/1996 |
| JP | 2004-022743 A | 1/2004 |
| JP | 2006-228772 A | 8/2006 |
| JP | 2012-195324 A | 10/2012 |
| JP | 2015-065469 A | 4/2015 |
| WO | 2014/192444 A1 | 12/2014 |

OTHER PUBLICATIONS

An Office Action issued by the German Patent and Trademark Office on Oct. 27, 2023, which corresponds to German Patent Application No. 112020006511.1 and is related to U.S. Appl. No. 17/774,080; with English language translation.

An Office Action; "Notice of Reasons for Refusal," mailed by the Japanese Patent Office on May 16, 2023, which corresponds to Japanese Patent Application No. 2021-571084 and is related to U.S. Appl. No. 17/774,080; with English language translation.

An Office Action; mailed by the China National Intellectual Property Administration of the People's Republic of China on Jan. 15, 2025, which corresponds to Chinese Patent Application No. 202080092316.1 and is related to U.S. Appl. No. 17/774,080.

Office Action issued in DE 11 2020 006 511.1; mailed by the German Patent and Trademark Office on Aug. 19, 2025.

* cited by examiner

FIG.4

SCHOTTKY BARRIER DIODE

FIELD

The present disclosure relates to a Schottky barrier diode.

BACKGROUND

Patent Literature 1 discloses a Schottky barrier diode in which on a surface of a semiconductor substrate of one conductivity type, a guard ring composed of a semiconductor layer of an opposite conductivity type is formed.

CITATION LIST

Patent Literature

[PTL 1] JP 63-138769 A

SUMMARY

Technical Problem

In the Schottky barrier diode disclosed in Patent Literature 1, if a forward current increases, a forward voltage drop across a pn junction to be formed between the guard ring and the semiconductor substrate may be lower than a forward voltage drop of a Schottky portion. As a result, a termination region may be destroyed due to current concentration.

The present disclosure has been made to solve the above-described problem, and is directed to obtaining a Schottky barrier diode capable of suppressing current concentration in a guard ring.

Solution to Problem

A Schottky barrier diode according to the present disclosure includes an n-type semiconductor substrate, one or more p-type guard rings provided on a side of an upper surface of the semiconductor substrate, an anode electrode provided on the upper surface of the semiconductor substrate, a cathode electrode provided on a rear surface of the semiconductor substrate and an insulating film provided on an inner guard ring on an innermost side among the one or more guard rings, wherein the anode electrode rides on the insulating film and has its end portion provided just above the inner guard ring, the anode electrode and the inner guard ring are provided away from each other, and a thickness of the insulating film is 1.0 μm or more.

A Schottky barrier diode according to the present disclosure includes an n-type semiconductor substrate, a plurality of p-type guard rings provided on a side of an upper surface of the semiconductor substrate, an anode electrode provided on the upper surface of the semiconductor substrate, a cathode electrode provided on a rear surface of the semiconductor substrate and an insulating film provided on an inner guard ring on an innermost side among the plurality of guard rings, wherein the anode electrode rides on the insulating film and has its end portion provided just above the inner guard ring, and the anode electrode and the inner guard ring are provided away from each other.

A Schottky barrier diode according to the present disclosure includes an n-type semiconductor substrate, one or more p-type guard rings provided on a side of an upper surface of the semiconductor substrate, an insulating film provided on an inner guard ring on an innermost side among the one or more guard rings, an anode electrode provided on the upper surface of the semiconductor substrate and riding on the insulating film, a cathode electrode provided on a rear surface of the semiconductor substrate and a high-resistance layer having a higher resistance than that of the inner guard ring and spacing the inner guard ring and the anode electrode apart from each other.

Advantageous Effects of Invention

In the Schottky barrier diode according to the present disclosure, the anode electrode and the guard ring are connected to each other via a capacitive component of the insulating film. Therefore, current concentration in the guard ring can be suppressed.

BRIEF DESCRIPTION OF DRAWINGS

FIG. 4 is a cross-sectional view of a Schottky barrier diode according to the third embodiment.

DESCRIPTION OF EMBODIMENTS

Figure 1:
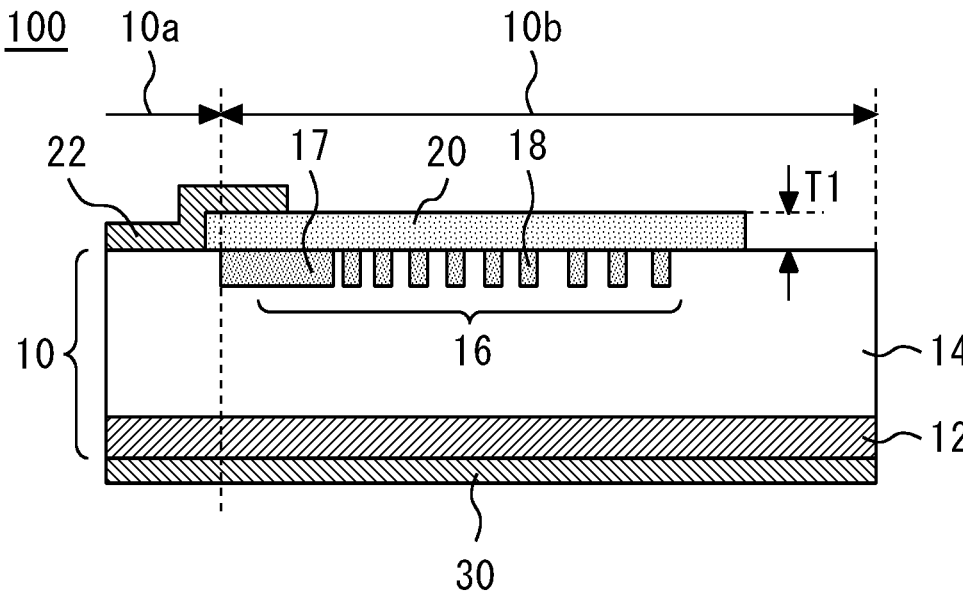
FIG. 1 is a cross-sectional view of a Schottky barrier diode according to the first embodiment.

A Schottky barrier diode according to each embodiments of the present disclosure is described with reference to drawings. Identical or corresponding constitutional elements are given the same reference numerals, and the repeated description of such constitutional elements may be omitted.

First Embodiment

FIG. 1 is a cross-sectional view of a Schottky barrier diode 100 according to the first embodiment. The Schottky barrier diode 100 includes a semiconductor substrate 10. The semiconductor substrate 10 is formed of silicon, for example. The semiconductor substrate 10 includes an n+-type semiconductor layer 12 and an n-type semiconductor layer 14 provided on the n+-type semiconductor layer 12.

A plurality of p-type guard rings 16 are provided on the side of an upper surface of the semiconductor substrate 10. The innermost guard ring 16 among the plurality of guard rings 16 is referred to as an inner guard ring 17. The guard ring 16 other than the inner guard ring 17 among the plurality of guard rings 16 is referred to as an outer guard ring 18.

The semiconductor substrate 10 includes a cell region 10a through which a main current of the Schottky barrier diode 100 flows and a termination region 10b surrounding the cell region 10a. In the present embodiment, an end portion on the inner side of the inner guard ring 17 is a boundary between the termination region 10b and the cell region 10a. The inner side is the side on which the cell region 10a is provided relative to the termination region 10*b* in the semiconductor substrate 10. The guard rings 16 are formed to surround the cell region 10*a*.

An anode electrode 22 is provided on the upper surface of the semiconductor substrate 10. The anode electrode 22 is electrically connected to the n-type semiconductor layer 14 in the cell region 10*a*. The anode electrode 22 is a Schottky barrier electrode. A cathode electrode 30 is provided on a rear surface of the semiconductor substrate 10. The cathode electrode 30 is electrically connected to the n+-type semiconductor layer 12.

An insulating film 20 is provided on the guard rings 16. A thickness T1 of the insulating film 20 is 1.0 μm or more, for example. The insulating film 20 covers an entire upper surface of the plurality of guard rings 16.

The anode electrode 22 rides on the insulating film 20. An end portion of the anode electrode 22 is provided just above the inner guard ring 17. The insulating film 20 is provided such that the anode electrode 22 and the inner guard ring 17 do not contact each other. Thus, the anode electrode 22 and the inner guard ring 17 are provided away from each other.

Generally in a Schottky barrier diode, a Schottky barrier electrode contacts a portion on the innermost periphery of a p-type guard ring region to transmit a potential to a guard ring so that its withstand voltage may be held. When a forward current increases, a forward voltage Vpn across a pn junction to be formed between the guard ring and a semiconductor substrate may be lower than a forward voltage VF of a Schottky portion. Accordingly, a current may concentrate in the guard ring particularly during reflux, for example.

On the other hand, in the present embodiment, the anode electrode 22 and the guard rings 16 are connected to each other via the insulating film 20. Accordingly, a forward voltage Vpn of a path connecting the anode electrode 22, the insulating film 20, the inner guard ring 17, and the n-type semiconductor layer 14 can be adjusted by a capacitive component of the insulating film 20. Accordingly, the forward voltage Vpn can be adjusted not to be lower than a forward voltage VF between the anode electrode 22 and the n-type semiconductor layer 14. Therefore, current concentration in the guard rings 16 can be suppressed. As a result, destruction due to thermal runaway of the Schottky barrier diode 100 can be avoided.

The capacitive component of the insulating film 20 may be adjusted to satisfy Vpn>VF within a previously determined current range. The previously determined current range is a range of a current flowing at the time of driving the Schottky barrier diode 100, for example.

When the anode electrode 22 is formed to overlap the guard rings 16 with the insulating film 20 interposed therebetween, a potential in the vicinity of the boundary between the cell region 10*a* and the termination region 10*b* can be stabilized.

The current concentration may occur in the vicinity of the boundary between the cell region 10*a* and the termination region 10*b*. Accordingly, particularly when the inner guard ring 17 among the plurality of guard rings 16 and the anode electrode 22 do not contact each other, the current concentration can be effectively suppressed. Accordingly, at least the inner guard ring 17 among the plurality of guard rings 16 may be spaced apart from the anode electrode 22. That is, all the guard rings 16 may be spaced apart from the anode electrode 22, or the outer guard ring 18 may be in contact with the anode electrode 22.

The insulating film 20 may be provided on at least the inner guard ring 17. The insulating film 20 may cover the entire upper surface of the inner guard ring 17 and expose the outer guard ring 18. If the inner guard ring 17 and the anode electrode 22 do not contact each other, a part of the inner guard ring 17 may be exposed from the insulating film 20.

The thickness T1 of the insulating film 20 in the present embodiment is 1 μm or more. As a comparative example of the present embodiment, a thin insulating film having a thickness of 0.5 μm or less, for example, may be formed such that an inversion layer of a p-type channel is formed on a lower part of an insulating film 20. At this time, the inversion layer may be formed in only a shallower region than a guard ring. Accordingly, a depletion layer does not easily extend toward a termination region so that its curvature may increase. Therefore, a withstand voltage of a Schottky barrier diode may decrease.

On the other hand, in the present embodiment, the thickness T1 of the insulating film 20 is set to 1.0 μm or more such that an inversion layer is not formed in the vicinity of the inner guard ring 17. As a result, a lower part of the insulating film 20 can be prevented from being channel-inverted. An electrostatic capacitance is ensured by the insulating film 20 so that respective potentials of the anode electrode 22 and the guard rings 16 can be fixed. The insulating film 20 may be formed of a deposited oxide film derived from TEOS (tetra ethoxy silane) or the like.

The thickness T1 of the insulating film 20 may be less than 1.0 μm if the current concentration can be suppressed. In the present embodiment, it is assumed that the plurality of guard rings 16 are provided. The available configuration is not limited to this, and any configuration in which at least one guard ring 16 is provided may be used.

When the anode electrode 22 is extend to above the outer guard ring 18, an electric field distribution changes so that the withstand voltage may decrease. A creepage distance between the anode electrode 22 and another metal portion is shortened so that discharges may be induced. On the other hand, in the present embodiment, the end portion of the anode electrode 22 is provided just above the inner guard ring 17. Accordingly, the outer guard ring 18 is not capacitively coupled to the anode electrode 22 via the insulating film 20. Therefore, the withstand voltage can be prevented from decreasing. The creepage distance can be ensured.

A configuration according to the present embodiment makes it possible to adjust the capacitive component depending on an overlapping area between the inner guard ring 17 and the anode electrode 22.

Figure 2:
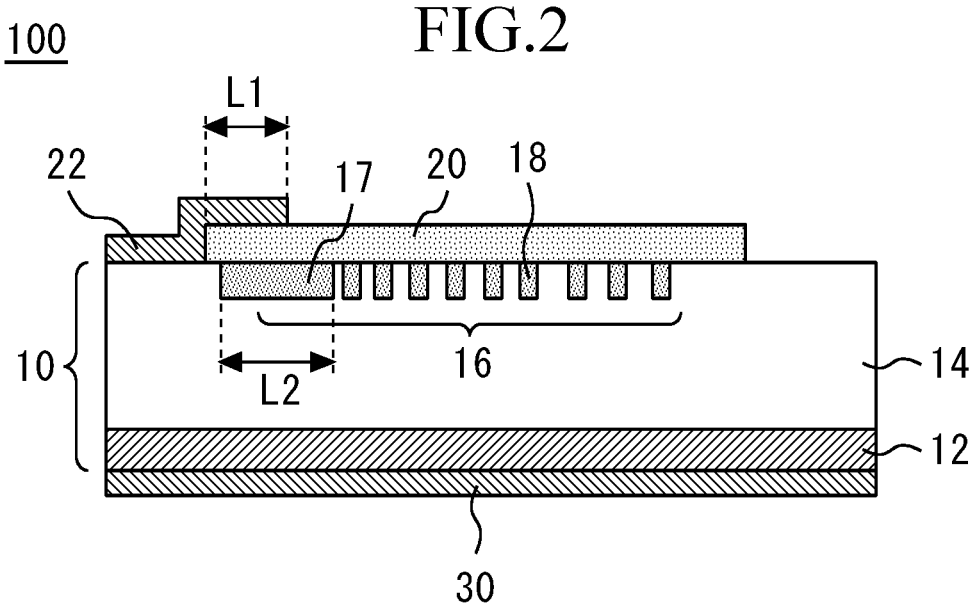
FIG. 2 is a diagram for describing dimensions of the Schottky barrier diode according to the first embodiment.

FIG. 2 is a diagram for describing dimensions of the Schottky barrier diode 100 according to the first embodiment. A width L2 of the inner guard ring 17 may be a width L1 or more of a portion, which rides on the insulating film 20, of the anode electrode 22. For example, L1=20 μm, and L2=50 μm. As a result, even when a positional relationship between the anode electrode 22 and the inner guard ring 17 has shifted due to a manufacturing variation, the end portion of the anode electrode 22 can be reliably arranged just above the inner guard ring 17. Therefore, the anode electrode 22 and the inner guard ring 17 can be reliably capacitively coupled to each other. The anode electrode 22 and the outside guard ring 18 can be prevented from being capacitively coupled to each other.

The semiconductor substrate 10 may be made with a wide band gap semiconductor having a larger band gap than that of silicon. The wide band gap semiconductor is a silicon carbide, gallium oxide, or gallium nitride-based material or diamond, for example. As a result, the forward voltage Vpn can be increased. Particularly when a gallium oxide or the like having a larger band gap than that of a silicon carbide is used, a current burden in the cell region 10a is increased so that the current concentration in the guard rings 16 can be suppressed.

These modifications can be applied, as appropriate, to Schottky barrier diodes according to the following embodiments. Note that the Schottky barrier diodes according to the following embodiments are similar to that of the first embodiment in many respects, and thus differences between the Schottky barrier diodes according to the following embodiments and that of the first embodiment will be mainly described below.

Second Embodiment

Figure 3:
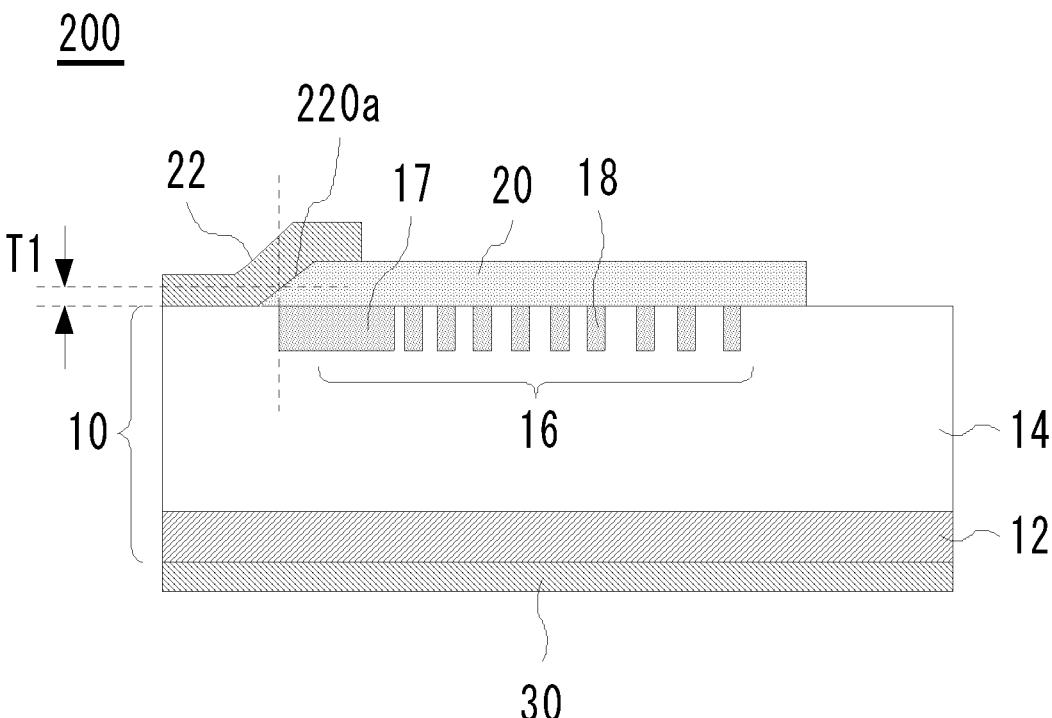
FIG. 3 is a cross-sectional view of a Schottky barrier diode according to the second embodiment.

FIG. 3 is a cross-sectional view of a Schottky barrier diode 200 according to the second embodiment. The Schottky barrier diode 200 differs from the Schottky barrier diode 100 in a shape of an insulating film 20. In the first embodiment, the end portion on the inner side of the insulating film 20 has a right-angled shape. On the other hand, an end portion, which is provided on the inner side of a semiconductor substrate 10, out of end portions of the insulating film 20 according to the present embodiment has a tapered shape.

The insulating film 20 has a tapered portion 220a that thins toward the end portion thereof. In the present embodiment, a capacitive component can be adjusted depending on an angle of the end portion of the insulating film 20. A capacitance can be adjusted without changing a maximum value of the thickness of the insulating film 20.

A thickness T1 of the insulating film 20 is 1.0 μm or more just above an end portion, which is provided on the inner side of the semiconductor substrate 10, out of end portions of an inner guard ring 17, for example. As a result, an inversion layer can be prevented from being formed, like in the first embodiment.

The tapered portion 220a is provided just above the end portion on the inner side of the inner guard ring 17. As a result, a forward voltage Vpn can be adjusted at a position at which a current easily concentrates. The available configuration is not limited to this, and any configuration in which the tapered portion 220a is provided in a portion sandwiched between an anode electrode 22 and guard rings 16 may be used. As a result, an effect of the adjustment of the capacitive component is obtained.

Third Embodiment

Figure 4:
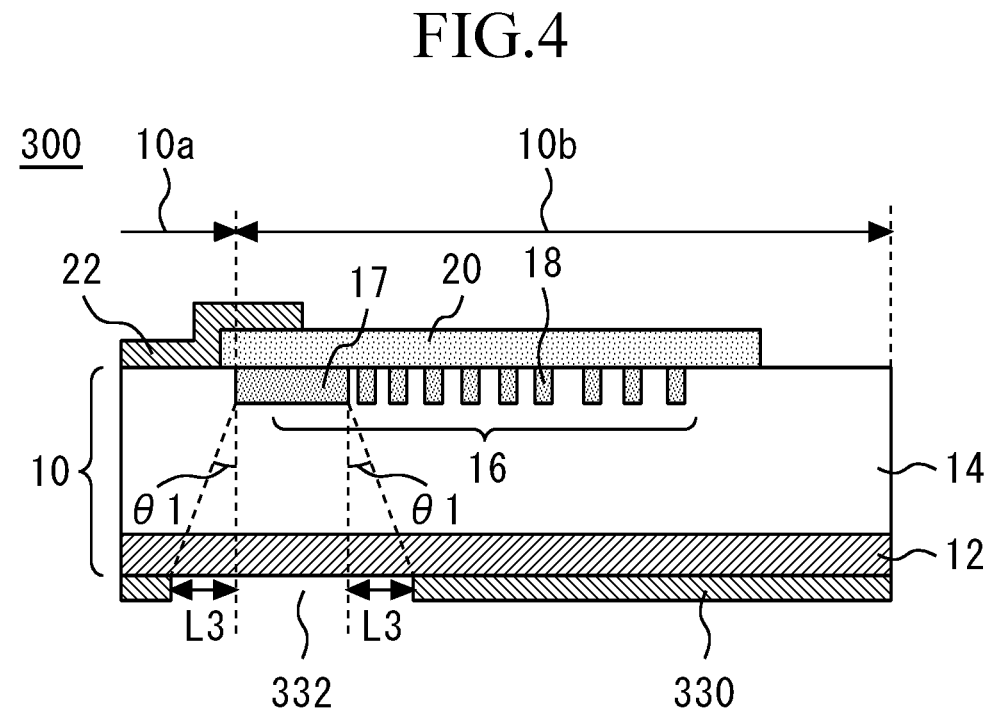

FIG. 4 is a cross-sectional view of a Schottky barrier diode 300 according to the third embodiment. The Schottky barrier diode 300 differs from the Schottky barrier diode 100 in a structure of a cathode electrode 330. In the cathode electrode 330, an opening 332 that exposes a semiconductor substrate 10 is formed just below an inner guard ring 17.

A part, just below the inner guard ring 17, of the cathode electrode 330 is removed. Accordingly, the cathode electrode 330 is separated into the side of a cell region 10a and the side of a termination region 10b. As a result, a current path from the inner guard ring 17 is lengthened so that a forward voltage Vpn can be increased. When the area of the cathode electrode 330 decreases, the forward voltage Vpn can be increased. Therefore, current concentration in guard rings 16 can be suppressed.

In the present embodiment, the opening 332 exposes the semiconductor substrate 10 in a predetermined range L3 from just below the inner guard ring 17. The forward voltage Vpn can be adjusted by adjusting the distance L3. The distance L3 is a drift layer thickness, for example. An angle formed between a virtual line connecting an end portion of the inner guard ring 17 and an end portion of the cathode electrode 330 and a vertical line perpendicular to the rear surface of the semiconductor substrate 10 is set to θ1. The forward voltage Vpn can be adjusted by changing θ1. The larger θ1 is, the higher the forward voltage Vpn becomes.

A strength at the time of die bonding can be improved by a portion, on the side of the termination region 10b, of the cathode electrode 330 separated by the opening 332. The portion, on the side of the termination region 10b, of the separated cathode electrode 330 may be omitted.

In an example illustrated in FIG. 4, the area of the opening 332 is larger than the area of the inner guard ring 17. The available configuration is not limited to this, and any configuration in which the opening 332 is formed in at least a part of a portion, just below the inner guard ring 17, of the cathode electrode 330 may be used.

Fourth Embodiment

Figure 5:
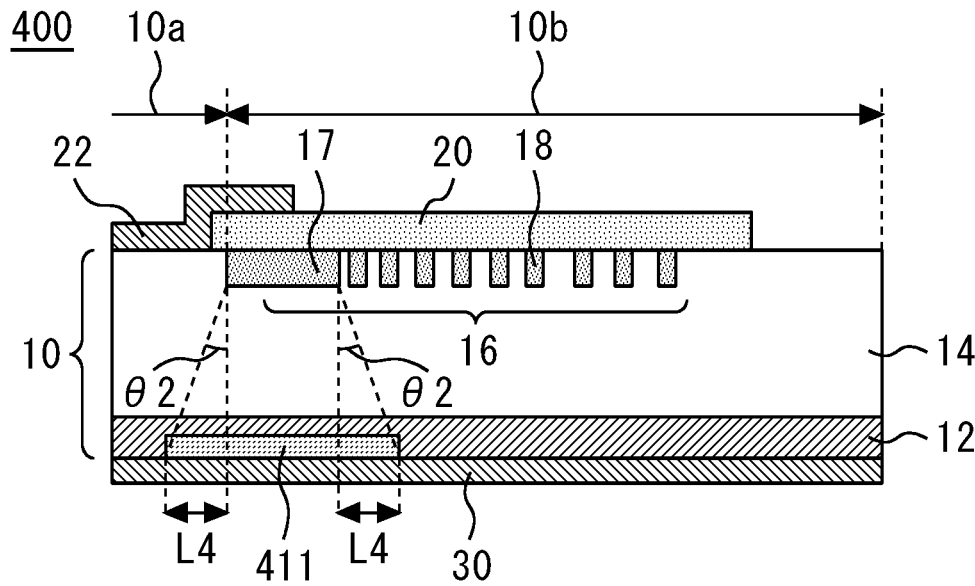
FIG. 5 is a cross-sectional view of a Schottky barrier diode according to the fourth embodiment.

FIG. 5 is a cross-sectional view of a Schottky barrier diode 400 according to the fourth embodiment. The Schottky barrier diode 400 differs from the Schottky barrier diode 100 in that it includes a second p-type semiconductor layer 411. The second p-type semiconductor layer 411 is provided just below an inner guard ring 17 in a semiconductor substrate 10. The second p-type semiconductor layer 411 is provided on the side of the rear surface of the semiconductor substrate 10.

A conductive region on the cathode side is limited by the second p-type semiconductor layer 411. That is, a current path toward the cathode side is lengthened by the second p-type semiconductor layer 411. Accordingly, a forward voltage Vpn can be further increased. Therefore, current concentration in guard rings 16 can be suppressed.

The second p-type semiconductor layer 411 is provided up to a predetermined range L4 from just below the inner guard ring 17. The forward voltage Vpn can be adjusted by adjusting the distance L4. An angle formed between a virtual line connecting an end portion of the inner guard ring 17 and an end portion of the second p-type semiconductor layer 411 and a vertical line perpendicular to the rear surface of the semiconductor substrate 10 is set to θ2. The forward voltage Vpn can be adjusted by changing θ2. The larger θ2 is, the higher the forward voltage Vpn becomes.

In an example illustrated in FIG. 5, the area of the second p-type semiconductor layer 411 is larger than the area of the inner guard ring 17. The available configuration is not limited to this, and any configuration in which at least a part of a portion, just below the inner guard ring 17, of the semiconductor substrate 10 is provided with the second p-type semiconductor layer 411 may be used. For example, the second p-type semiconductor layer 411 may be provided only just below the inner guard ring 17 in the semiconductor substrate 10. When the area of the second p-type semiconductor layer 411 in a cell region 10a is reduced, an effect of the second p-type semiconductor layer 411 on an electrical characteristic of the Schottky barrier diode 400 can be suppressed.

The second p-type semiconductor layer 411 is provided in an n+-type semiconductor layer 12, and is exposed to the rear surface of the semiconductor substrate 10. The available configuration is not limited to this, and a configuration in which the second p-type semiconductor layer 411 is provided at a position deeper than the rear surface of the semiconductor substrate 10 just below the inner guard ring 17 may also be used. That is, the second p-type semiconductor layer 411 may not be exposed to the rear surface of the semiconductor substrate 10. In this case, the current path toward the cathode side from the inner guard ring 17 can be lengthened so that the forward voltage Vpn can be increased.

The second p-type semiconductor layer 411 may be extended to an end portion of a termination region 10b.

Fifth Embodiment

Figure 6:
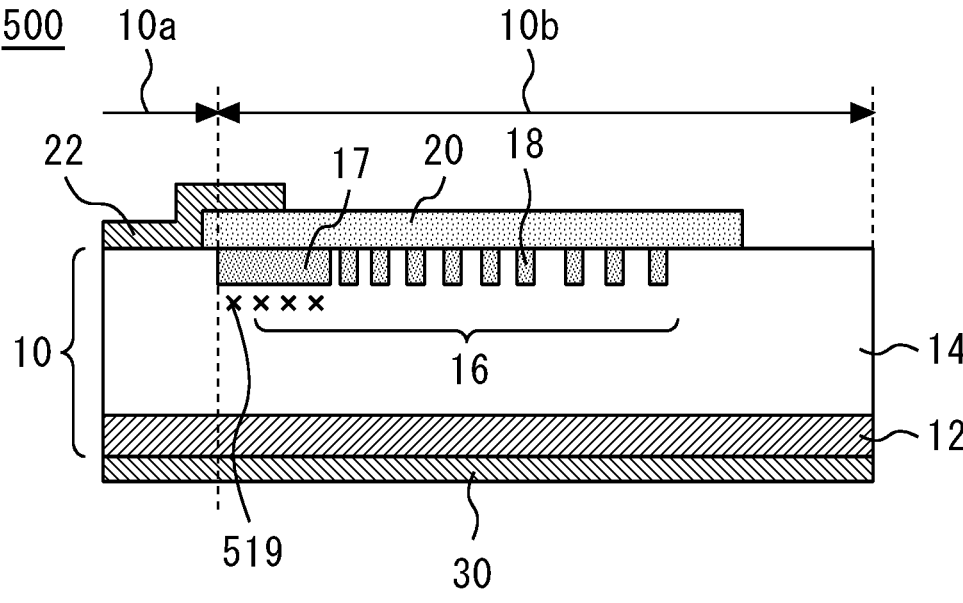
FIG. 6 is a cross-sectional view of a Schottky barrier diode according to the fifth embodiment.

FIG. 6 is a cross-sectional view of a Schottky barrier diode 500 according to the fifth embodiment. The Schottky barrier diode 500 differs from the Schottky barrier diode 100 in that it includes a crystal defect layer 519. The crystal defect layer 519 is provided just below an inner guard ring 17 in a semiconductor substrate 10. The crystal defect layer 519 is formed by ion irradiation, electron beam irradiation, or the like.

In the present embodiment, a forward voltage Vpn can be increased by an increase in speed of a pn junction. Therefore, current concentration in guard rings 16 can be suppressed.

The crystal defect layer 519 is provided only just below the inner guard ring 17 among the plurality of guard rings 16. As a result, a withstand voltage in a termination region 10b can be prevented from decreasing. The available configuration is not limited to this, and a configuration in which the crystal defect layer 519 is provided just below an outer guard ring 18 may also be used.

Sixth Embodiment

Figure 7:
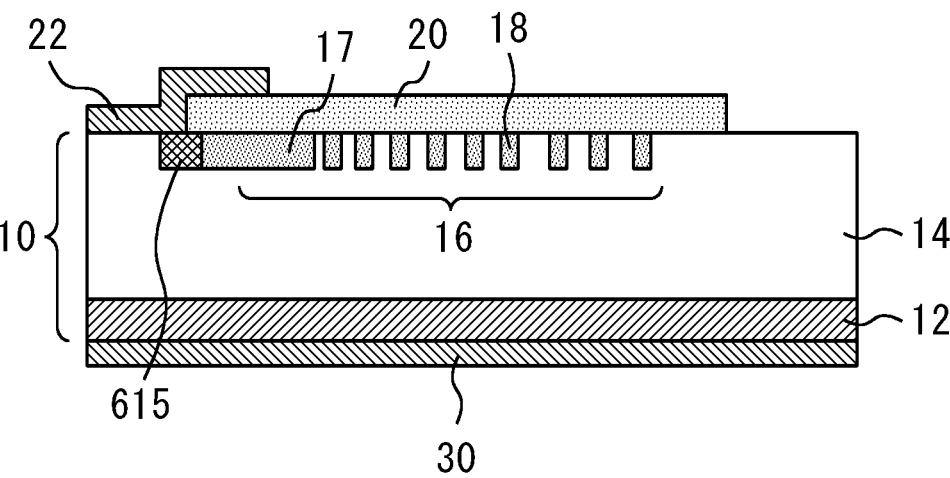
FIG. 7 is a cross-sectional view of a Schottky barrier diode according to the sixth embodiment.

FIG. 7 is a cross-sectional view of a Schottky barrier diode 600 according to the sixth embodiment. The Schottky barrier diode 600 differs from the Schottky barrier diode 100 in that it includes a first p-type semiconductor layer 615. The first p-type semiconductor layer 615 is provided more inwardly than an inner guard ring 17 and in contact with the inner guard ring 17 on the side of the upper surface of the semiconductor substrate 10. The first p-type semiconductor layer 615 has a lower concentration than that of the inner guard ring 17. The inner guard ring 17 and the first p-type semiconductor layer 615 are electrically connected to each other, and have the same potential.

An insulating film 20 covers an entire upper surface of the inner guard ring 17. The first p-type semiconductor layer 615 is exposed from the insulating film 20. An end portion, which is provided on the inner side of the semiconductor substrate 10, of the first p-type semiconductor layer 615 is exposed from the insulating film 20. Half or more of an upper surface of the first p-type semiconductor layer 615 is exposed from the insulating film 20. A portion, which is exposed from the insulating film 20, on the upper surface of the first p-type semiconductor layer 615 directly contacts an anode electrode 22.

The inner guard ring 17 and the anode electrode 22 are spaced apart from each other by the first p-type semiconductor layer 615. The first p-type semiconductor layer 615 has a higher resistance than that of the inner guard ring 17. A contact resistance between the first p-type semiconductor layer 615 having a lower impurity concentration than that of the inner guard ring 17 and the anode electrode 22 is higher than a contact resistance between the inner guard ring 17 and the anode electrode 22. As a result, current concentration in guard rings 16 can be suppressed, like in the first embodiment.

In the present embodiment, the first p-type semiconductor layer 615 is provided more inwardly than the inner guard ring 17. The available configuration is not limited to this, and any configuration in which the first p-type semiconductor layer 615 is provided to space the anode electrode 22 and the inner guard ring 17 apart from each other may be used. For example, the inner guard ring 17 may be included in the first p-type semiconductor layer 615.

A high-resistance layer that spaces the inner guard ring 17 and the anode electrode 22 apart from each other is not limited to the first p-type semiconductor layer 615. The inner guard ring 17 and the anode electrode 22 may be spaced apart from each other by a layer having a higher resistance than that of the inner guard ring 17. The inner guard ring 17 and the anode electrode 22 may be spaced apart from each other by a layer having a higher contact resistance with the anode electrode 22 than the contact resistance between the inner guard ring 17 and the anode electrode 22.

In the present embodiment, the anode electrode 22 has its end portion provided just above the inner guard ring 17. The available configuration is not limited to this, and a configuration in which the anode electrode 22 is extend to above an outer guard ring 18 may also be used.

Seventh Embodiment

Figure 8:
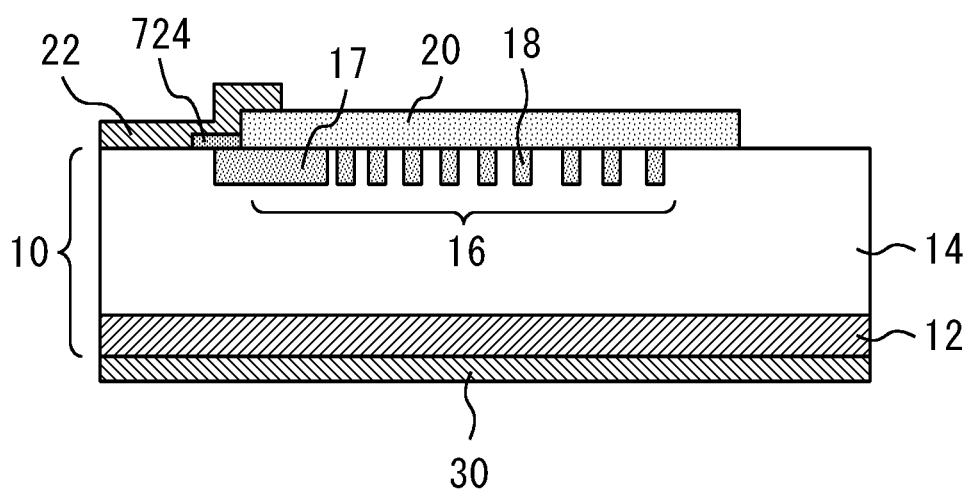
FIG. 8 is a cross-sectional view of a Schottky barrier diode according to the seventh embodiment.

FIG. 8 is a cross-sectional view of a Schottky barrier diode 700 according to the seventh embodiment. In the present embodiment, the Schottky barrier diode 700 differs from the Schottky barrier diode 100 in an arrangement of an insulating film 20 and in that it includes a resistor 724. The insulating film 20 covers a plurality of guard rings 16 except for a part of an inner guard ring 17. The inner guard ring 17 includes an exposure portion exposed from the insulating film 20 in an end portion, which is provided on the inner side of the semiconductor substrate 10, out of its end portions. The resistor 724 covers the exposure portion.

The resistor 724 is a polysilicon resistor, for example. The resistor 724 is provided more inwardly than the insulating film 20 on an upper surface of the semiconductor substrate 10. The resistor 724 is adjacent to the insulating film 20. The resistor 724 has a higher resistance than that of the inner guard ring 17. An anode electrode 22 rides on the resistor 724 and the insulating film 20.

In the present embodiment, the resistor 724 corresponds to a high-resistance layer that spaces the inner guard ring 17 and the anode electrode 22 apart from each other. A resistive component of the resistor 724 makes it possible to suppress current concentration in the guard rings 16, like in the sixth embodiment.

Arrangement of the resistor 724 is not limited to that illustrated in FIG. 8. The resistor 724 may be provided between the anode electrode 22 and the inner guard ring 17. For example, the resistor 724 may be provided in the semiconductor substrate 10.

As the high-resistance layer, both a first p-type semiconductor layer 615 described in the sixth embodiment and the resistor 724 may be provided. As a result, a forward voltage Vpn can be further increased.

Note that the technical features described in the above embodiments may be combined as appropriate.

REFERENCE SIGNS LIST 10 semiconductor substrate, 10a cell region, 10b termination region, 12 n+-type semiconductor layer, 14 n-type semiconductor layer, 16 guard ring, 17 inner guard ring, 18 outer guard ring, 20 insulating film, 22 anode electrode, 30 cathode electrode, 100, 200 Schottky barrier diode, 220*a* tapered portion, 300 Schottky barrier diode, 330 cathode electrode, 332 opening, 400 Schottky barrier diode, 411 second p-type semiconductor layer, 500 Schottky barrier diode, 519 crystal defect layer, 600 Schottky barrier diode, 615 first p-type semiconductor layer, 700 Schottky barrier diode, 724 resistor

The invention claimed is:

1. A Schottky barrier diode comprising:
an n-type semiconductor substrate;
one or more p-type guard rings provided on a side of an upper surface of the semiconductor substrate;
an anode electrode provided on the upper surface of the semiconductor substrate;
a cathode electrode provided on a rear surface of the semiconductor substrate; an insulating film provided on an inner guard ring on an innermost side among the one or more guard rings; and
a high-resistance layer having a higher resistance than that of the inner guard ring and spacing the inner guard ring and the anode electrode apart from each other, wherein
the anode electrode rides on the insulating film and has its end portion provided just above the inner guard ring,
the inner guard ring extends further on the innermost side than an edge of the insulating film that is covered by the anode electrode,
the anode electrode and the inner guard ring are provided away from each other,
the high-resistance layer includes a polysilicon resistor provided further on the innermost side than the insulating film on the upper surface of the semiconductor substrate, and
a thickness of the insulating film is 1.0 μm or more.

2. The Schottky barrier diode according to claim 1, wherein a width of the inner guard ring is equal to or more than a width of a portion, which rides on the insulating film, of the anode electrode.

3. The Schottky barrier diode according to claim 1, wherein an end portion, which is provided on an inner side of the semiconductor substrate, out of end portions of the insulating film has a tapered shape.

4. The Schottky barrier diode according to claim 1, wherein the thickness of the insulating film is 1.0 μm or more just above an end portion, which is provided on the inner side of the semiconductor substrate, out of end portions of the inner guard ring.

5. The Schottky barrier diode according to claim 1, wherein the cathode electrode has an opening, which exposes the semiconductor substrate, formed therein just below the inner guard ring.

6. The Schottky barrier diode according to claim 5, wherein the opening exposes the semiconductor substrate in a predetermined range from just below the inner guard ring.

7. The Schottky barrier diode according to claim 1, further comprising a second p-type semiconductor layer provided just below the inner guard ring in the semiconductor substrate.

8. The Schottky barrier diode according to claim 7, wherein the second p-type semiconductor layer is provided up to a predetermined range from just below the inner guard ring.

9. The Schottky barrier diode according to claim 1, further comprising a crystal defect layer provided just below the inner guard ring in the semiconductor substrate.

10. The Schottky barrier diode according to claim 1, wherein the semiconductor substrate is made with a wide band gap semiconductor.

11. The Schottky barrier diode according to claim 10, wherein the wide band gap semiconductor is silicon carbide, gallium oxide, gallium-nitride-based material or diamond.

12. A Schottky barrier diode comprising:
an n-type semiconductor substrate;
a plurality of p-type guard rings provided on a side of an upper surface of the semiconductor substrate;
an anode electrode provided on the upper surface of the semiconductor substrate;
a cathode electrode provided on a rear surface of the semiconductor substrate;
an insulating film provided on an inner guard ring on an innermost side among the plurality of guard rings; and
a high-resistance layer having a higher resistance than that of the inner guard ring and spacing the inner guard ring and the anode electrode apart from each other, wherein
the anode electrode rides on the insulating film and has its end portion provided just above the inner guard ring,
the inner guard ring extends further on the innermost side than an edge of the insulating film that is covered by the anode electrode,
the high-resistance layer includes a polysilicon resistor provided further on the innermost side than the insulating film on the upper surface of the semiconductor substrate, and
the anode electrode and the inner guard ring are provided away from each other.

13. The Schottky barrier diode according to claim 12, wherein the thickness of the insulating film is 1.0 μm or more.

14. The Schottky barrier diode according to claim 12, wherein a width of the inner guard ring is equal to or more than a width of a portion, which rides on the insulating film, of the anode electrode.

15. The Schottky barrier diode according to claim 12, wherein an end portion, which is provided on an inner side of the semiconductor substrate, out of end portions of the insulating film has a tapered shape.

16. The Schottky barrier diode according to claim 12, wherein the thickness of the insulating film is 1.0 μm or more just above an end portion, which is provided on the inner side of the semiconductor substrate, out of end portions of the inner guard ring.

17. The Schottky barrier diode according to claim 12, wherein the cathode electrode has an opening, which exposes the semiconductor substrate, formed therein just below the inner guard ring.

18. The Schottky barrier diode according to claim 17, wherein the opening exposes the semiconductor substrate in a predetermined range from just below the inner guard ring.

19. The Schottky barrier diode according to claim 12, further comprising a second p-type semiconductor layer provided just below the inner guard ring in the semiconductor substrate.

20. The Schottky barrier diode according to claim 19, wherein the second p-type semiconductor layer is provided up to a predetermined range from just below the inner guard ring.

21. The Schottky barrier diode according to claim 12, further comprising a crystal defect layer provided just below the inner guard ring in the semiconductor substrate.

22. The Schottky barrier diode according to claim 12, wherein the semiconductor substrate is made with a wide band gap semiconductor.

23. The Schottky barrier diode according to claim 22, wherein the wide band gap semiconductor is silicon carbide, gallium oxide, gallium-nitride-based material or diamond.

24. A Schottky barrier diode comprising:

an n-type semiconductor substrate;

one or more p-type guard rings provided on a side of an upper surface of the semiconductor substrate;

an insulating film provided on an inner guard ring on an innermost side among the one or more guard rings;

an anode electrode provided on the upper surface of the semiconductor substrate and riding on the insulating film, the inner guard ring extending further on the innermost side than an edge of the insulating film that is covered by the anode electrode;

a cathode electrode provided on a rear surface of the semiconductor substrate; and a high-resistance layer having a higher resistance than that of the inner guard ring and spacing the inner guard ring and the anode electrode apart from each other, the high-resistance layer including a polysilicon resistor provided further on the innermost side than the insulating film on the upper surface of the semiconductor substrate.

25. The Schottky barrier diode according to claim 24, wherein the high-resistance layer includes a first p-type semiconductor layer having a lower concentration than that of the inner guard ring and is provided more inwardly than the inner guard ring and in contact with the inner guard ring on the side of the upper surface of the semiconductor substrate.

26. The Schottky barrier diode according to claim 24, wherein the inner guard ring includes an exposure portion exposed from the insulating film in an end portion, which is provided on an inner side of the semiconductor substrate, out of end portions of the insulating film, and the polysilicon resistor covers the exposure portion.

27. The Schottky barrier diode according to claim 24, wherein the anode electrode has its end portion provided just above the inner guard ring.

28. The Schottky barrier diode according to claim 24, wherein a thickness of the insulating film is 1.0 μm or more.

29. The Schottky barrier diode according to claim 24, wherein the cathode electrode has an opening, which exposes the semiconductor substrate, formed therein just below the inner guard ring.

30. The Schottky barrier diode according to claim 29, wherein the opening exposes the semiconductor substrate in a predetermined range from just below the inner guard ring.

31. The Schottky barrier diode according to claim 24, further comprising a second p-type semiconductor layer provided just below the inner guard ring in the semiconductor substrate.

32. The Schottky barrier diode according to claim 31, wherein the second p-type semiconductor layer is provided up to a predetermined range from just below the inner guard ring.

33. The Schottky barrier diode according to claim 24, further comprising a crystal defect layer provided just below the inner guard ring in the semiconductor substrate.

34. The Schottky barrier diode according to claim 24, wherein the semiconductor substrate is made with a wide band gap semiconductor.

35. The Schottky barrier diode according to claim 34, wherein the wide band gap semiconductor is silicon carbide, gallium oxide, gallium-nitride-based material or diamond.

36. A Schottky barrier diode comprising:

an n-type semiconductor substrate;

one or more p-type guard rings provided on a side of an upper surface of the semiconductor substrate;

an insulating film provided on an inner guard ring on an innermost side among the one or more guard rings;

an anode electrode provided on the upper surface of the semiconductor substrate and riding on the insulating film;

a cathode electrode provided on a rear surface of the semiconductor substrate; and a high-resistance layer having a higher resistance than that of the inner guard ring and spacing the inner guard ring and the anode electrode apart from each other, the high-resistance layer including a polysilicon resistor provided further on the innermost side than the insulating film on the upper surface of the semiconductor substrate.

37. The Schottky barrier diode according to claim 36, wherein the inner guard ring includes an exposure portion exposed from the insulating film in an end portion, which is provided on an inner side of the semiconductor substrate, out of its-end portions of the insulating film, and the polysilicon resistor covers the exposure portion.

* * * * *